(12) United States Patent
Gill

(10) Patent No.: US 6,788,502 B1
(45) Date of Patent: Sep. 7, 2004

(54) CO-FE SUPERMALLOY FREE LAYER FOR MAGNETIC TUNNEL JUNCTION HEADS

(75) Inventor: Hardayal (Harry) Singh Gill, Portola Valley, CA (US)

(73) Assignee: International Business Machines Corporation, Armonk, NY (US)

( * ) Notice: Subject to any disclaimer, the term of this patent is extended or adjusted under 35 U.S.C. 154(b) by 549 days.

(21) Appl. No.: 09/388,885

(22) Filed: Sep. 2, 1999

(51) Int. Cl.[7] .............................................. G11B 5/139
(52) U.S. Cl. .................................................. 360/324.2
(58) Field of Search ........................ 360/324.2, 324.12; 324/252, 207.21; 338/38 R

(56) References Cited

U.S. PATENT DOCUMENTS

| | | | |
|---|---|---|---|
| 5,206,590 A | 4/1993 | Dieny et al. ................ 324/252 |
| 5,650,958 A | 7/1997 | Gallagher et al. .......... 365/173 |
| 5,747,997 A | * 5/1998 | Dahlberg et al. ........... 324/252 |
| 5,905,611 A | * 5/1999 | Yoda et al. ............... 360/324.1 |

* cited by examiner

Primary Examiner—George J. Letscher
(74) Attorney, Agent, or Firm—William D. Gill

(57) ABSTRACT

A magnetic tunnel junction sensor is provided having a laminated free layer comprising a first sublayer formed of Co—Fe in contact with a spacer layer and a second sublayer formed of Ni—Fe—Mo. The Ni—Fe—Mo material of the second sublayer has a magnetocrystalline anisotropy constant, k, that is much smaller than that of Ni—Fe. Due to the small value of k of the Ni—Fe—Mo material used to fabricate the second sublayer of the free layer, the thickness of the Co—Fe first sublayer may be increased to improve manufacturability while retaining a low net stiffness of the free layer for high sensitivity of the MTJ sensor in response to signal fields from data magnetically recorded on a disk. The thicker Co—Fe first sublayer results in a higher magnetoresistance coefficient of the improved MTJ sensor.

22 Claims, 6 Drawing Sheets

CO-FE SUPERMALLOY FREE LAYER FOR MAGNETIC TUNNEL JUNCTION HEADS

CROSS REFERENCE TO RELATED APPLICATION

U.S. patent application Ser. No. 09/388,885, entitled Co—Fe/SUPERMALLOY FREE LAYER FOR GIANT MAGNETORESISTANCE HEADS, was filed on the same day, owned by a common assignee and having the same inventor as the present invention.

BACKGROUND OF THE INVENTION

1. Field of the Invention

This invention relates generally to magnetoresistive sensors for reading information signals from a magnetic medium and, in particular, to giant magnetoresistive and magnetic tunnel junction sensors with a Co—Fe/Supermalloy free layer.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe) separated by a layer of non-magnetic material (e.g., copper) are generally referred to as spin valve (SV) sensors manifesting the SV effect.

FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a non-magnetic, electrically conducting spacer layer 115. Hard bias layers 130 and 135 formed in the end regions 104 and 106, respectively, provide longitudinal bias for the free layer 110. Leads 140 and 145 formed on hard bias layers 130 and 135, respectively, provide electrical connections for sensing the resistance of the SV sensor 100. IBM's U.S. Pat. No. 5,206,590 granted to Dieny et al., incorporated herein by reference, discloses a GMR sensor operating on the basis of the SV effect.

Another type of SV sensor is an antiparallel (AP)-pinned SV sensor. In AP-pinned SV sensors, the pinned layer is a laminated structure of two ferromagnetic layers separated by a non-magnetic coupling layer such that the magnetizations of the two ferromagnetic layers are strongly coupled together antiferromagnetically in an antiparallel orientation. The AP-pinned SV sensor provides improved exchange coupling of the antiferromagnetic (AFM) layer to the laminated pinned layer structure than is achieved with the pinned layer structure of the SV sensor of FIG. 1. This improved exchange coupling increases the stability of the AP-pinned SV sensor at high temperatures which allows the use of corrosion resistant antiferromagnetic materials such as NiO for the AFM layer.

Referring to FIG. 2, an AP-pinned SV sensor 200 comprises a free layer 210 separated from a laminated AP-pinned layer structure 220 by a nonmagnetic, electrically-conducting spacer layer 215. The magnetization of the laminated AP-pinned layer structure 220 is fixed by an AFM layer 230. The laminated AP-pinned layer structure 220 comprises a first ferromagnetic layer 226 and a second ferromagnetic layer 222 separated by an antiparallel coupling (APC) layer 224 of nonmagnetic material (usually ruthenium (Ru)). The two ferromagnetic layers 226, 222 (FM1 and FM2) in the laminated AP-pinned layer structure 220 have their magnetization directions oriented antiparallel, as indicated by the arrows 227, 223 (arrows pointing out of and into the plane of the paper respectively).

Yet another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

FIG. 3 shows a prior art MTJ sensor 300 comprising a first electrode 304, a second electrode 302, and a tunnel barrier 315. The first electrode 304 comprises a pinned layer (pinned ferromagnetic layer) 320, an antiferromagnetic (AFM) layer 330, and a seed layer 340. The magnetization of the pinned layer 320 is fixed through exchange coupling with the AFM layer 330. The second electrode 302 comprises a free layer (free ferromagnetic layer) 310 and a cap layer 305. The free layer 310 is separated from the pinned layer 320 by a non-magnetic, electrically insulating tunnel barrier layer 315. In the absence of an external magnetic field, the free layer 310 has its magnetization oriented in the direction shown by arrow 312, that is, generally perpendicular to the magnetization direction of the pinned layer 320 shown by arrow 322 (tail of the arrow that is pointing into the plane of the paper). A first lead 360 and a second lead 365 formed in contact with first electrode 304 and second electrode 302, respectively, provide electrical connections for the flow of sensing current $I_s$ from a current source 370 to the MTJ sensor 300. A signal detector 380, typically including a recording channel such as a partial-response maximum-likelihood (PRML) channel, connected to the first and second leads 360 and 365 senses the change in resistance due to changes induced in the free layer 310 by the external magnetic field.

The use of Co—Fe ($Co_{90}$—$Fe_{10}$) for the free layer material in both GMR and MTJ sensors is very desirable since a higher GMR coefficient or magnetic tunneling coefficient is obtained with this material. However, the material Co—Fe has a high magnetocrystalline anisotropy constant, k, and therefore a high anisotropy field, $H_k=2k/M$, where M is the magnetization. When Co—Fe is used to fabricate the free layer of either GMR or MTJ sensors, the high $H_k$ of the Co—Fe material results in a free layer having a high degree of magnetic stiffness. A magnetically stiff free layer is less sensitive for reading magnetic signal fields from the data magnetically stored on the disk since higher fields are needed to rotate the direction of the magnetic moment of the free layer in response to the signal field. To overcome this difficulty, prior art SV sensors have used a multilayer laminated free layer having a very thin sublayer formed of Co—Fe deposited adjacent to the spacer layer and a thicker sublayer formed of Ni—Fe deposited on the Co—Fe layer. The thin Co—Fe sublayer of the laminated free layer improves the GMR coefficient while the thicker Ni—Fe sublayer having a relatively low $H_k$ results in an acceptable small net or effective $H_k$ for the free layer of the sensor.

However, the need for higher data storage density requires GMR or MTJ sensors having very thin free layers. As the total free layer thickness is decreased, the thickness of the Co—Fe sublayer must be decreased to less than 10 Å in order to obtain the desired low stiffness free layer. Manufacturability of sensors having critical sublayers with thicknesses less than 10 Å becomes difficult because of the difficulty of controlling layer thickness to better than +/−2 Å across the large diameter substrate wafers used in batch production of the sensors. Manufacturing yields of GMR and MTJ sensors are significantly reduced by variations of sensor characteristics caused by these layer thickness tolerance problems.

Therefore there is a need for GMR and MTJ sensors having layer thicknesses that are manufacturable at high yields while maintaining desirable free layer sensitivity and improved GMR and MTJ coefficients.

SUMMARY OF THE INVENTION

It is an object of the present invention to disclose an MTJ sensor having a laminated free layer comprising a first sublayer formed of $Co_{90}$—$Fe_{10}$ (Co—Fe) and a second sublayer formed of $Ni_{79}$—$Fe_{16}$—$Mo_5$ (supermalloy).

It is another object of the present invention to disclose an MTJ sensor having a laminated free layer comprising a Co—Fe first sublayer and a supermalloy second sublayer having an increased magnetic tunneling resistance coefficient due to an increased Co—Fe sublayer thickness while maintaining a low effective $H_k$ for the free layer.

It is a further object of the present invention to disclose an MTJ sensor having high sensitivity and increased magnetic tunneling resistance coefficient that is manufacturable at improved yields.

It is yet another object of the present invention to disclose an MTJ sensor having improved sensitivity due to a reduced stiffness of the free layer.

In accordance with the principles of the present invention, there is disclosed a magnetic tunnel junction sensor having a laminated multilayer free layer comprising a first sublayer formed of Co—Fe and a second sublayer formed of Ni—Fe—Mo. The Ni—Fe—Mo material of the second sublayer has a magnetocrystalline anisotropy constant, k, that is a factor of ten smaller than that of Ni—Fe. Due to small value of k of the Ni—Fe—Mo material used to fabricate the second sublayer of the free layer, the thickness of the first sublayer made of Co—Fe may be increased to improve manufacturability without sacrificing low stiffness of the free layer needed for a high sensitivity of the MTJ sensor in response to signal fields from data magnetically recorded on a disk.

In the preferred embodiment of the present invention, the free layer of an MTJ sensor comprises a first sublayer formed of $Co_{90}$—$Fe_{10}$ having a thickness of about 10 Å deposited in contact with a tunnel layer layer and a second sublayer formed of $Ni_{79}$—$Fe_{16}$—$Mo_5$ having a thickness of about 74 Å deposited on the first sublayer. The effective anisotropy field, $H_k$, of the laminated Co—Fe/Ni—Fe—Mo free layer having this structure is the same as the $H_k$ of the free layer of prior art MTJ sensors having laminated Co—Fe/Ni—Fe free layer structures in which the Co—Fe thickness is only 7 Å. The 42% increase in thickness of the Co—Fe sublayer of the present invention substantially improves manufacturing yields of batch production of the SV sensor of the present invention.

Advantages of the MTJ sensor of the present invention employing a Co—Fe/Ni—Fe—Mo laminated free layer include improved manufacturability, a higher magnetic tunneling resistance coefficient, and low stiffness of the free layer in response to signal fields.

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
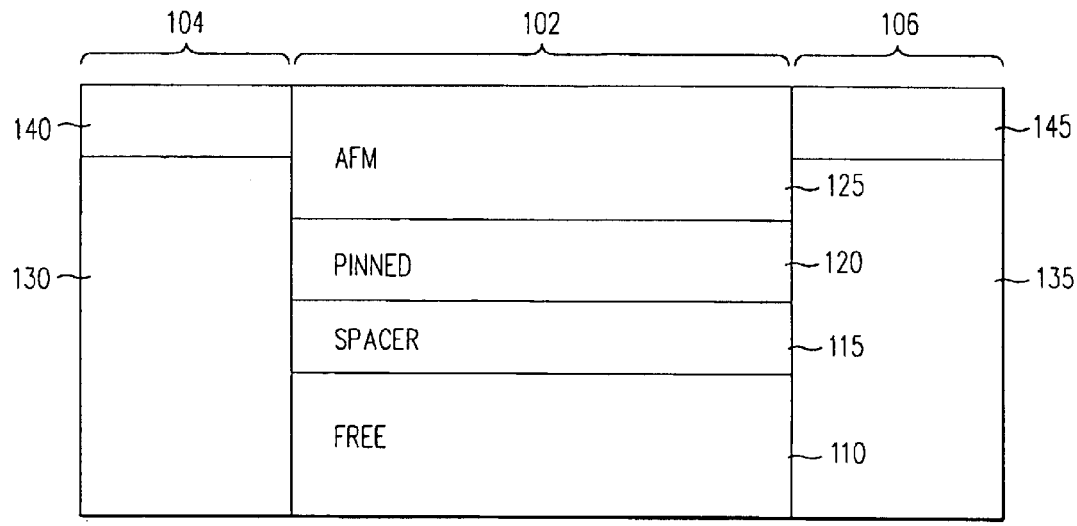
FIG. 1 is an air bearing surface view, not to scale, of a prior art SV sensor.
Figure 2:
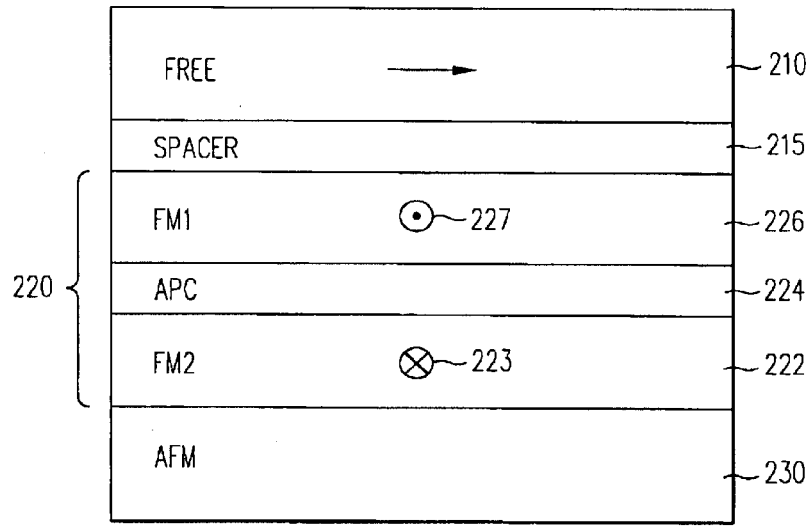
FIG. 2 is an air bearing surface view, not to scale, of a prior art AP-pinned SV sensor.
Figure 3:
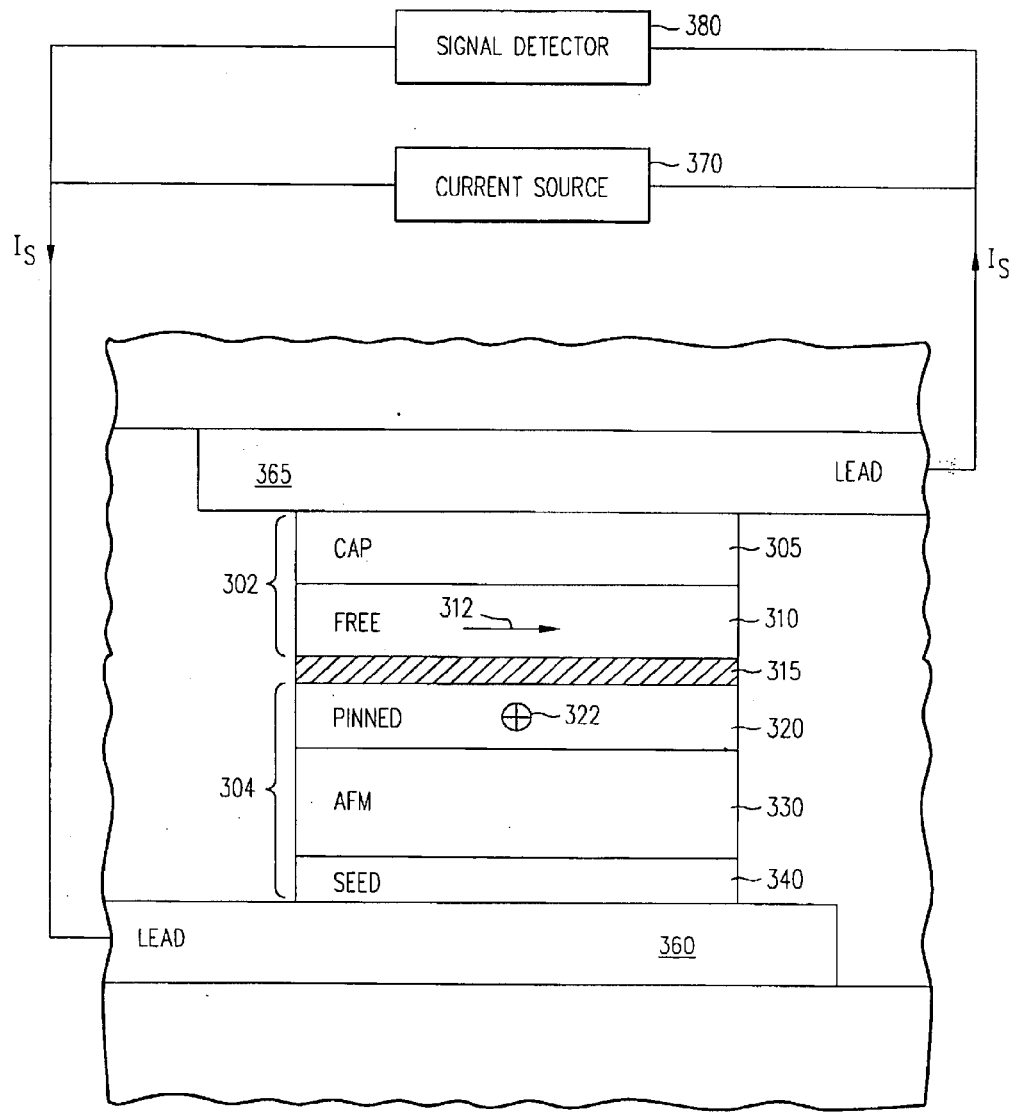
FIG. 3 is an air bearing surface view, not to scale, of a prior art magnetic tunnel junction sensor.
Figure 4:
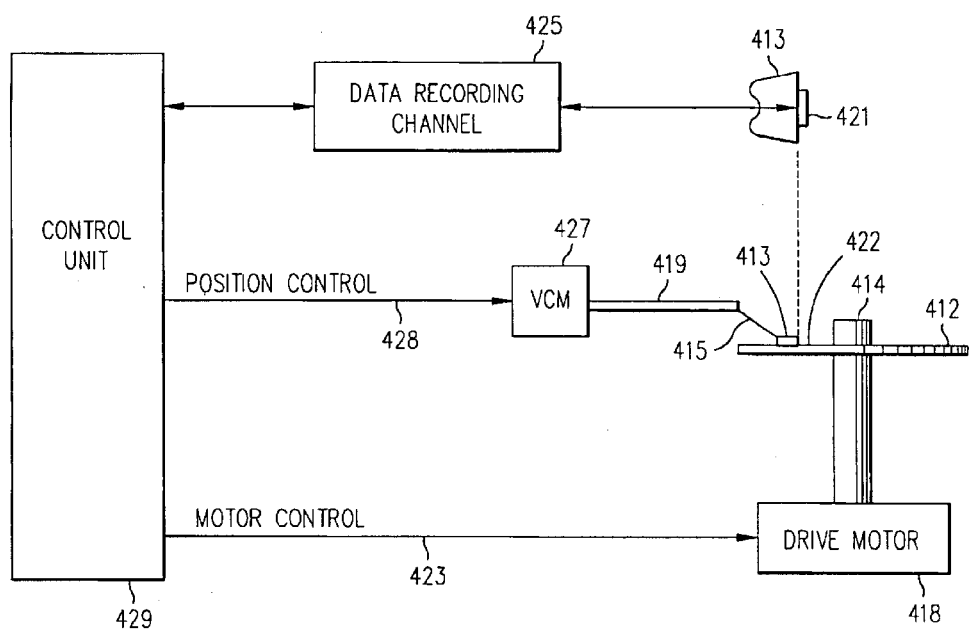
FIG. 4 is a block diagram of a magnetic recording disk drive system.

Referring now to FIG. 4, there is shown a disk drive 400 embodying the present invention. As shown in FIG. 4, at least one rotatable magnetic disk 412 is supported on a spindle 414 and rotated by a disk drive motor 418. The magnetic recording media on each disk is in the form of an annular pattern of concentric data tracks (not shown) on the disk 412.

At least one slider 413 is positioned on the disk 412, each slider 413 supporting one or more magnetic read/write head 421 where the heads 421 incorporate the SV sensor of the present invention. As the disks rotate, the slider 413 is moved radially in and out over the disk surface 422 so that the heads 421 may access different portions of the disk where desired data is recorded. Each slider 413 is attached to an actuator arm 419 by means of a suspension 415. The suspension 415 provides a slight spring force which biases the slider 413 against the disk surface 422. Each actuator arm 419 is attached to an actuator 427. The actuator as shown in FIG. 4 may be a voice coil motor (VCM). The VCM comprises a coil movable within a fixed magnetic field, the direction and speed of the coil movements being controlled by the motor current signals supplied by a controller 429.

During operation of the disk storage system, the rotation of the disk 412 generates an air bearing between the slider 413 (the surface of the slider 413 which includes the head 421 and faces the surface of the disk 412 is referred to as an air bearing surface (ABS)) and the disk surface 422 which exerts an upward force or lift on the slider. The air bearing thus counter-balances the slight spring force of the suspension 415 and supports the slider 413 off and slightly above the disk surface by a small, substantially constant spacing during normal operation.

The various components of the disk storage system are controlled in operation by control signals generated by the control unit 429, such as access control signals and internal clock signals. Typically, the control unit 429 comprises logic control circuits, storage chips and a microprocessor. The control unit 429 generates control signals to control various system operations such as drive motor control signals on line 423 and head position and seek control signals on line 428. The control signals on line 428 provide the desired current profiles to optimally move and position the slider 413 to the desired data track on the disk 412. Read and write signals are communicated to and from the read/write heads 421 by means of the recording channel 425.

The above description of a typical magnetic disk storage system, and the accompanying illustration of FIG. 4 are for representation purposes only. It should be apparent that disk storage systems may contain a large number of disks and actuator arms, and each actuator arm may support a number of sliders.

Figure 5:
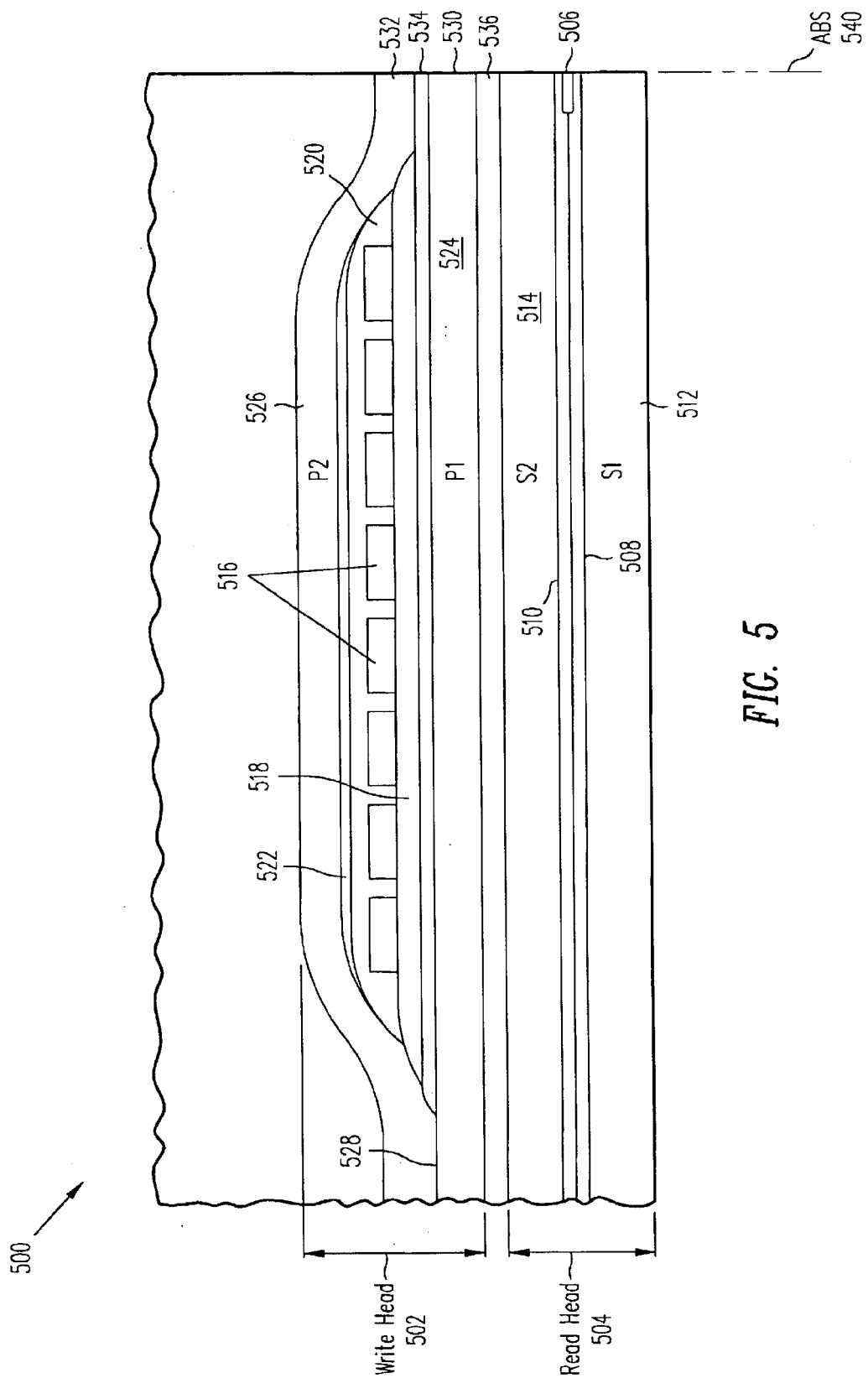
FIG. 5 is a vertical cross-section view (not to scale) of a "piggyback" read/write magnetic head.

FIG. 5 is a side cross-sectional elevation view of a "piggyback" magnetic read/write head 500, which includes a write head portion 502 and a read head portion 504, the read head portion employing a magnetic tunnel junction sensor 506 according to the present invention. The magnetic tunnel junction sensor 506 is sandwiched between nonmagnetic insulating first and second read gap layers 508 and 510, and the read gap layers are sandwiched between ferromagnetic first and second shield layers 512 and 514. In response to external magnetic fields, the resistance of the magnetic tunnel junction sensor 506 changes. A sense current $I_s$ conducted through the sensor causes these resistance changes to be manifested as potential changes. These potential changes are then processed as readback signals by the processing circuitry of the data recording channel 425 shown in FIG. 4.

The write head portion 502 of the magnetic read/write head 500 includes a coil layer 516 sandwiched between first and second insulation layers 518 and 520. A third insulation layer 522 may be employed for planarizing the head to eliminate ripples in the second insulation layer 520 caused by the coil layer 516. The first, second and third insulation layers are referred to in the art as an insulation stack. The coil layer 516 and the first, second and third insulation layers 518, 520 and 522 are sandwiched between first and second pole piece layers 524 and 526. The first and second pole piece layers 524 and 526 are magnetically coupled at a back gap 528 and have first and second pole tips 530 and 532 which are separated by a write gap layer 534 at the ABS 540. An insulation layer 536 is located between the second shield layer 514 and the first pole piece layer 524. Since the second shield layer 514 and the first pole piece layer 524 are separate layers this read/write head is known as a "piggyback" head.

Figure 6:
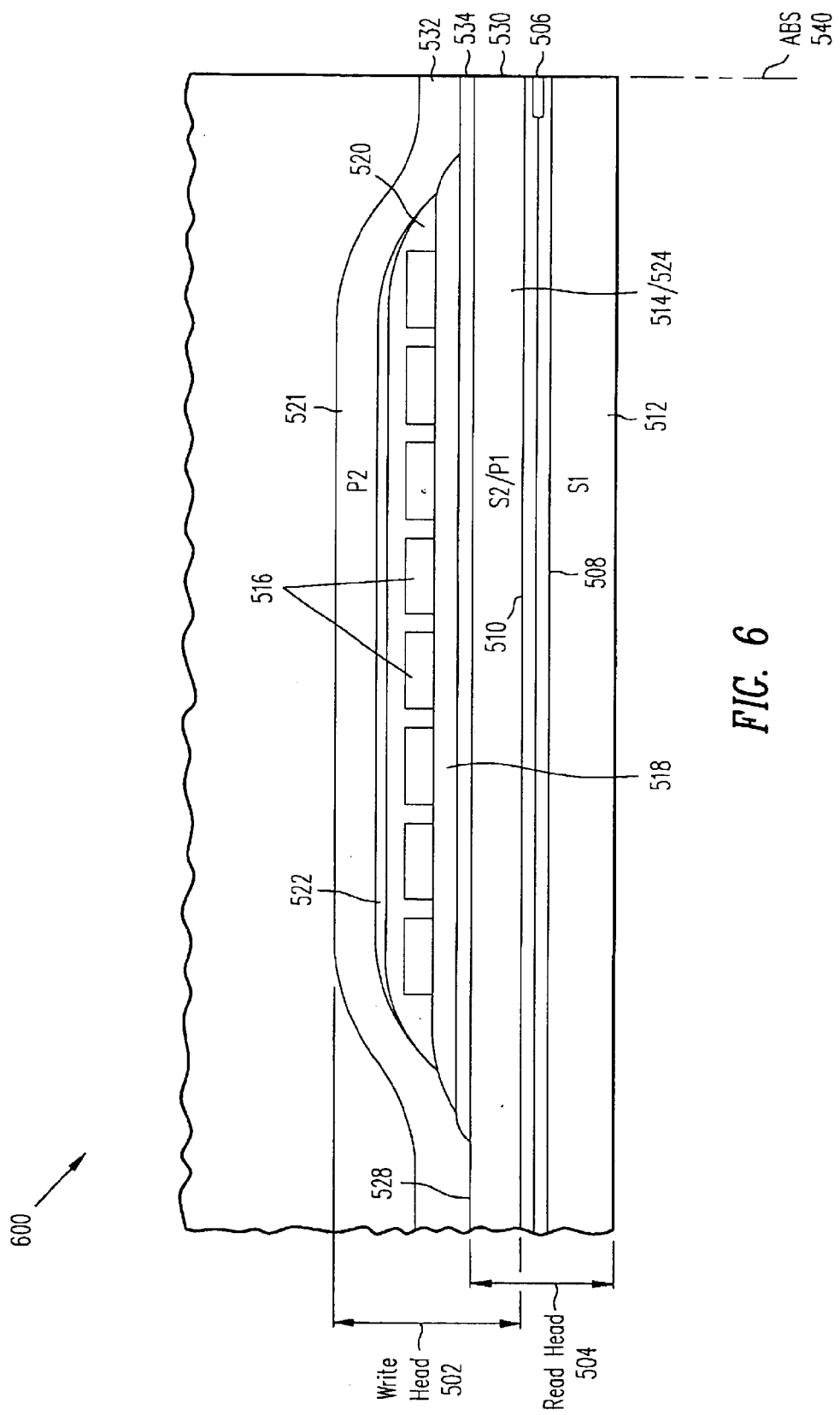
FIG. 6 is a vertical cross-section view (not to scale) of a "merged" read/write magnetic head.

FIG. 6 is the same as FIG. 5 except the second shield layer 514 and the first pole piece layer 524 are a common layer. This type of read/write head is known as a "merged" head 600. The insulation layer 536 of the piggyback head in FIG. 5 is omitted in the merged head 600 of FIG. 6.

Figure 7:
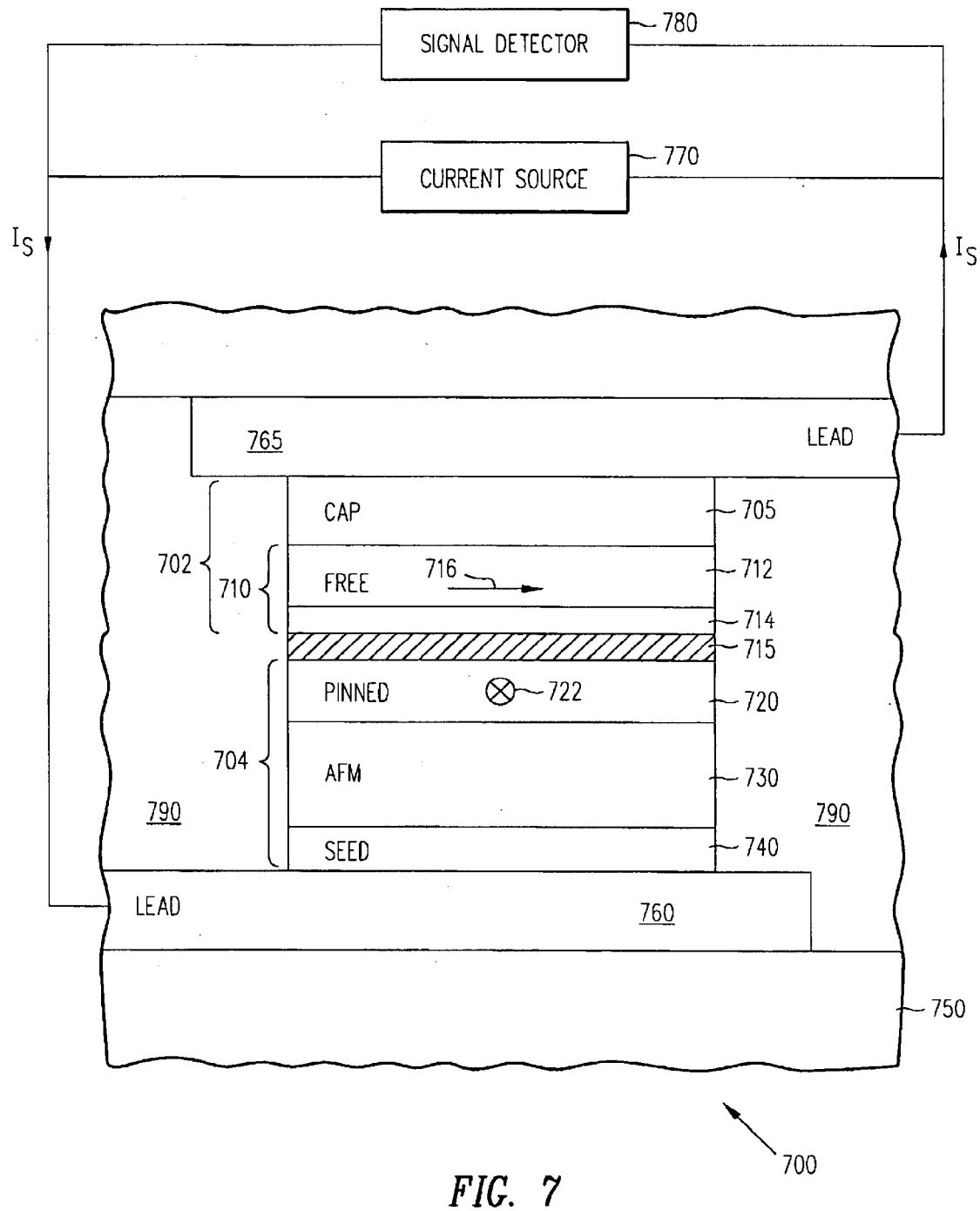
FIG. 7 is an air bearing surface view, not to scale, of an embodiment of an MTJ sensor according to the present invention.

FIG. 7 shows an air bearing surface (ABS) view of a magnetic tunnel junction (MTJ) sensor 700 according to an embodiment of the present invention. The MTJ sensor 700 comprises a first electrode 704, a second electrode 702, and a nonmagnetic, electrically insulating tunnel barrier layer 715 disposed between the first electrode 704 and the second electrode 702. The first electrode 704 comprises a pinned layer (pinned ferromagnetic layer) 720, an antiferromagnetic (AFM) layer 730, and a seed layer 740, where the AFM layer 730 is disposed between the pinned layer 720 and the seed layer 740. The second electrode 702 includes a laminated free layer (free ferromagnetic layer) 710 and a cap layer 705 where the free layer 710 is disposed between the cap layer 705 and the tunnel barrier layer 715.

The free layer 710 comprises a first sublayer 714 and a second sublayer 712, where the first sublayer 714 is disposed between the second sublayer 712 and the tunnel barrier layer 715. The direction of magnetization of the free layer 710, indicated by an arrow 716 is oriented parallel to the ABS and is free to rotate in the presence of a signal magnetic field.

Lead layers 760 and 765 adjacent to the first electrode 704 and the second electrode 702, respectively, provide electrical connection for the flow of sensing current Is from a current source 770 to the MTJ sensor 700. A signal detector 780 which is electrically connected to the leads 760 and 765 senses the change in the tunneling current due to changes induced in the free layer 710 by the signal magnetic field (e.g., field generated by a data bit stored on a disk). The external magnetic field acts to rotate the direction of magnetization 716 of the free layer 710 relative to the direction of magnetization 722 (indicated by the tail of an arrow pointing into the plane of the paper) of the pinned layer 720 which is preferably pinned perpendicular to the ABS. The signal detector 780 preferably comprises a partial response maximum likelihood (PRML) recording channel for processing the signal detected by the MTJ sensor 700. Alternatively, a peak detect channel or a maximum likelihood channel (e.g., 1,7 ML) may be used. The design and implementation of the aforementioned channels are known to those skilled in the art. The signal detector 780 also includes other supporting circuitries such as a preamplifier (electrically placed between the sensor and the channel) for conditioning the sensed resistance changes as is known to those skilled in the art.

The MTJ sensor 700 is fabricated in a magnetron sputtering or an ion beam sputtering system to sequentially deposit the multilayer structure shown in FIG. 7. The sputter deposition process is carried out in the presence of a transverse magnetic field of about 40 Oe to orient the easy axis of all the ferromagnetic layers. The bottom lead layer 760 formed of gold (Au) having a thickness in the range of 100–500 Å is deposited on a substrate 750 of preferably $Al_2O_3$. The seed layer 740 is a layer deposited to modify the crystallographic texture or grain size of the subsequent layers, and may not be needed depending on the substrate and AFM materials. If used, the seed layer may be formed of tantalum (Ta), zirconium (Zr), or nickel-iron (Ni—Fe) having a thickness of 30–50 Å. The AFM layer 730 formed of Pt—Mn having a thickness of about 200 Å is deposited on the seed layer 740. The pinned layer 720 formed of $Co_{90}$—$Fe_{10}$ having a thickness of about 30 Å is deposited on the AFM layer 730. The tunnel barrier layer 715 is formed of $Al_2O_3$ by depositing and then plasma oxidizing an 8–20 Å aluminum (Al) layer on the pinned layer 720.

The free layer 710 comprising the first sublayer 714 and the second sublayer 712 is deposited on the tunnel barrier layer 715. The first sublayer 714 formed of $Co_{90}$—$Fe_{10}$ having a thickness in the range 7–12 Å, preferably about 10 Å, is deposited directly on the tunnel barrier layer 715. The second sublayer 712 formed of $Ni_{79}$—$Fe_{16}$—$Mo_5$ having a thickness in the range 60–80 Å, preferably about 74 Å, is deposited on the first sublayer 714. The cap layer 705 formed of Ta having a thickness of about 50 Å is deposited on the second sublayer 712 to complete the active portion of the MTJ sensor 700.

The top lead 765 formed of gold (Au) having a thickness of 100–500 Å is deposited over the cap layer 705. An insulating layer 790 formed of $Al_2O_3$ deposited between the bottom lead 760 and the top lead 765 provides electrical insulation between the leads and prevents shunting of the sense current around the MTJ sensor 700.

After the deposition of the MTJ sensor 700 is completed, the sensor is annealed in the presence of a magnetic field of about 800 Oe oriented in the transverse direction to the ABS and is then cooled while still in the magnetic field to set the exchange coupling of the AFM layer 730 with the pinned layer 720 transverse to the ABS. The AFM layer 730 pins the magnetic moment 722 (represented in FIG. 7 by the tail of an arrow pointing into the plane of the paper) of the pinned layer 720 in a direction perpendicular to the ABS.

A novel feature of the present invention is the use of Ni—Fe—Mo (supermalloy) to form the second sublayer 712 of the laminated free layer 710. While Ni—Fe (permalloy), commonly used in forming the free layer, has a value of the anisotropy field $H_k$ equal to about 5 Oe, Ni—Fe—Mo has a value of $H_k$ equal to about 0.5 Oe or about one tenth the Ni—Fe anisotropy field. This low value of the anisotropy field makes it possible to make a Co—Fe/Ni—Fe—Mo laminated free layer 710 having a thicker first sublayer 714 formed of Co—Fe than in a Co—Fe/Ni—Fe laminated free layer known to the art. Increasing the thickness of the Co—Fe first sublayer from about 7 Å in the Co—Fe/Ni—Fe free layer to about 10 Å in the Co—Fe/Ni—Fe—Mo free layer 710 of the present invention without increasing the effective anisotropy field of the laminated free layer significantly improves manufacturability yield while retaining the desirable low stiffness of the free layer. The manufacturability yield is impacted by the difficulty of controllably depositing very thin layers (layer less than about 10 Å in thickness) having uniform thickness across the large diameter wafers used as the substrates in batch fabrication of read/write heads including the MTJ sensors.

The effective anisotropy field of a laminated free layer having a first sublayer formed of a first material and a second sublayer formed of a second material may be calculated using the following equation:

$$H_k=2(k_1t_1+k_2t_2)/(M_1t_1+M_2t_2),$$

where $k_1$=magnetocrystalline anisotropy of the first material
$k_2$=magnetocrystalline anisotropy of the second material
$M_1$=magnetization of the first material
$M_2$=magnetization of the second material
$t_1$=thickness of the layer of the first material
$t_2$=thickness of the layer of the second material.

The values of the materials constants k and M for Co—Fe, Ni—Fe and Ni—Fe—Mo are listed in Table 1.

TABLE 1

Magnetocrystalline anisotropy constants (k in ergs/cc) and magnetization (M in emu/cc) for Co—Fe, Ni—Fe and Ni—Fe—Mo

| Material | k (ergs/cc) | M (emu/cc) |
|---|---|---|
| $Co_{90}$—$Fe_{10}$ | $2.28 \times 10^4$ | 1600 |
| $Ni_{80}$—$Fe_{20}$ | $1.20 \times 10^3$ | 800 |
| $Ni_{79}$—$Fe_{16}$—$Mo_5$ | $1.20 \times 10^2$ | 640 |

For a prior art Co—Fe/Ni—Fe laminated free layer having a Co—Fe thickness of 7 Å and a Ni—Fe thickness of 62 Å, the effective $H_k$ calculated from the above equation has a value of 7.7 Oe. The equation for effective $H_k$ may be used to verify that the use of a Ni—Fe—Mo layer having a thickness of 74 Å for the second sublayer 712 of the free layer 720 allows the first sublayer 714 formed of Co—Fe to have a thickness of 10 Å while maintaining the value of effective $H_k$ for the free layer 720 equal to 7.7 Oe. Therefore, by using Ni—Fe—Mo having a thickness of 74 Å in place of Ni—Fe having a thickness of 62 Å to fabricate the second sublayer 712 of the MTJ sensor 700 of this invention, a 42% increase in the thickness (7 Å to 10 Å) of the first sublayer 714 formed of Co—Fe is achieved while keeping the value of the effective $H_k$, and therefore the magnetic stiffness of the free layer, unchanged.

A further advantage of the present invention is that the increased thickness from 7 Å to about 10 Å of the Co—Fe first sublayer 714 will result in an increased magnetoresistance coefficient for the MTJ sensor 700.

Alternatively, the MTJ sensor 700 shown in FIG. 7 may be fabricated to have the first sublayer 714 of the free layer 720 formed of Co—Fe having a thickness of about 7 Å deposited on the tunnel barrier layer 715. The second sublayer 712 formed of Ni—Fe—Mo having a thickness of 74 Å is deposited on the first sublayer 714 to complete the free layer 710. Using the equation for effective $H_k$ of a laminated free layer given above, having a thinner Co—Fe first sublayer 714 (7 Å instead of 10 Å) results in a value of effective $H_k$ equal to 5.7 Oe. The lower value of effective $H_k$ for the free layer results in higher sensitivity of the MTJ sensor due to reduced stiffness of the free layer magnetic moment in response to signal fields. However, the MTJ sensor with the thinner Co—Fe first sublayer will not have the manufacturability advantages obtained by using a thicker Co—Fe first sublayer.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited only as specified in the appended claims.

I claim:

1. A magnetic tunnel junction (MTJ) magnetoresistive sensor comprising:
   an antiferromagnetic (AFM) layer;
   a tunnel barrier layer;
   a pinned layer disposed between the antiferromagnetic layer and the tunnel barrier layer; and
   a ferromagnetic free layer formed on the tunnel barrier layer, said free layer comprising:
      a first sublayer formed on the tunnel barrier layer; and
      a second sublayer formed on the first sublayer, wherein said second sublayer is made of supermalloy (Ni—Fe—Mo) having a thickness in the range of 60–80 Å.

2. The MTJ sensor as recited in claim 1, wherein the first sublayer of said free layer is made of Co—Fe.

3. The MTJ sensor as recited in claim 2, wherein the first sublayer has a thickness of about 10 Å.

4. The MTJ sensor as recited in claim 3, wherein the second sublayer has a thickness of about 74 Å.

5. The MTJ sensor as recited in claim 2, wherein the first sublayer has a thickness in the range of 7 to 12 Å.

6. The MTJ sensor as recited in claim 1, wherein the AFM layer is made of Pt—Mn.

7. The MTJ sensor as recited in claim 1, wherein the tunnel barrier layer is made of $Al_2O_3$.

8. The MTJ sensor as recited in claim 1, wherein the pinned layer is made of Co—Fe.

9. A magnetic read/write head comprising:
   a write head including:
      at least one coil layer and an insulation stack, the coil layer being embedded in the insulation stack; first and second pole piece layers connected at a back gap and having pole tips with edges forming a portion of an air bearing surface (ABS); the insulation stack being sandwiched between the first and second pole piece layers; and
      a write gap layer sandwiched between the pole tips of the first and second pole piece layers and forming a portion of the ABS;
   a read head including:
      a magnet tunnel junction (MTJ) sensor, first and second gap layers, and first and second shield layers, the MTJ sensor being sandwiched between the first and second gap layers and the first and second gap layers being sandwiched between the first and second shield layers; the MTJ sensor including:
         an antiferromagnetic (AFM) layer;
         a tunnel barrier layer;
         a pinned layer disposed between the AFM layer and the tunnel junction layer; and
         a ferromagnetic free layer formed on the tunnel junction layer, said free layer comprising:
            a first sublayer formed on the tunnel junction layer;
            a second sublayer formed on the first sublayer, wherein said second sublayer is made of supermalloy (Ni—Fe—Mo) having a thickness in the range of 60–80 Å; and
      an insulation layer disposed between the second shield layer of the read head and the first pole piece layer of the write head.

10. The read/write head as recited in claim 9, wherein the first sublayer of said free layer is made of Co—Fe.

11. The read/write head as recited in claim 10, wherein the first sublayer has a thickness of about 10 Å.

12. The read/write head as recited in claim 10, wherein the second sublayer has a thickness of about 74 Å.

13. The read/write head as recited in claim 10, wherein the first sublayer has a thickness in the range of 7 to 12 Å.

14. The read/write head as recited in claim 10, wherein the AFM layer is made of Pt—Mn.

15. The read/write head as recited in claim 9, wherein the tunnel junction layer is made of $Al_2O_3$.

16. A disk drive system comprising:
   a magnetic recording disk;
   a magnetic read/write head for magnetically recording data on the magnetic recording disk and for sensing magnetically recorded data on the magnetic recording disk, said magnetic read/write head comprising:
      a write head including:
         at least one coil layer and an insulation stack, the coil layer being embedded in the insulation stack;
         first and second pole piece layers connected at a back gap and having pole tips with edges forming a portion of an air bearing surface (ABS);
         the insulation stack being sandwiched between the first and second pole piece layers; and
         a write gap layer sandwiched between the pole tips of the first and second pole piece layers and forming a portion of the ABS;
      a read head including:
         a magnetic tunnel junction (MTJ) sensor, first and second gap layers, and first and second shield layers, the MTJ sensor being sandwiched between the first and second gap layers and the first and second gap layers being sandwiched between the first and second shield layers; the MTJ sensor including:
            an antiferromagnetic (AFM) layer;
            a tunnel junction layer;

a pinned layer disposed between the AFM layer and the tunnel junction layer; and a ferromagnetic free layer formed on the tunnel junction layer, said free layer comprising:

a first sublayer formed on the tunnel junction layer; and a second sublayer formed on the first sublayer, wherein said second sublayer is made of supermalloy (Ni—Fe—Mo) having a thickness in the range of 60–80 Å; and an insulation layer disposed between the second shield layer of the read head and the first pole piece layer of the write head;

an actuator for moving said magnetic read/write head across the magnetic disk so that the read/write head may access different regions of the magnetic recording disk; and a recording channel coupled electrically to the write head for magnetically recording data on the magnetic recording disk and to the MTJ sensor of the read head for detecting changes in resistance of the MTJ sensor caused by rotation of the magnetization axis of the free ferromagnetic layer relative to the fixed magnetization of the pinned layer in response to magnetic fields from the magnetically recorded data.

17. The disk drive system as recited in claim 16, wherein the first sublayer of said free layer is made of Co—Fe.

18. The disk drive system as recited in claim 17, wherein the first sublayer has a thickness of about 10 Å.

19. The disk drive system as recited in claim 17, wherein the second sublayer has a thickness of about 74 Å.

20. The disk drive system as recited in claim 17, wherein the first sublayer has a thickness in the range of 7 to 12 Å.

21. The disk drive system as recited in claim 16, wherein the AFM layer is made of Pt—Mn.

22. The disk drive system as recited in claim 16, wherein the tunnel junction layer is made of $Al_2O_3$.

* * * * *